United States Patent [19]

Kudo et al.

[11] Patent Number: 5,641,594
[45] Date of Patent: Jun. 24, 1997

[54] COLORED, PHOTOSENSITIVE RESIN COMPOSITION

[75] Inventors: Takanori Kudo; Yuko Nozaki; Kazuya Nagao; Yuki Nanjo; Hiroshi Okazaki; Yoshiaki Kinoshita; Seiya Masuda; Munirathna Padmanaban; Natsumi Suehiro, all of Saitama, Japan

[73] Assignee: Hoechst Japan Limited, Tokyo, Japan

[21] Appl. No.: 507,301

[22] PCT Filed: Dec. 12, 1994

[86] PCT No.: PCT/JP94/02085

§ 371 Date: Aug. 25, 1995

§ 102(e) Date: Aug. 25, 1995

[87] PCT Pub. No.: WO95/18399

PCT Pub. Date: Jul. 6, 1995

[30] Foreign Application Priority Data

Dec. 27, 1993 [JP] Japan .................... 5-348391

[51] Int. Cl.$^6$ .............. G03C 5/56; G03F 7/012; G03F 7/033
[52] U.S. Cl. .............. 430/7; 430/196; 430/197; 430/281.1
[58] Field of Search .................... 430/196, 197, 430/281.1, 7

[56] References Cited

U.S. PATENT DOCUMENTS

| | | | |
|---|---|---|---|
| 4,003,747 | 1/1977 | Tsunoda et al. | 430/196 |
| 4,356,247 | 10/1982 | Aotani et al. | 430/196 |
| 4,737,438 | 4/1988 | Ito et al. | 430/197 |
| 5,368,976 | 11/1994 | Tajima et al. | 430/196 |

FOREIGN PATENT DOCUMENTS

| | | |
|---|---|---|
| 0501433A1 | 9/1992 | European Pat. Off. . |
| 60-237403A | 11/1985 | Japan . |
| 1-152449A | 6/1989 | Japan . |
| 1-200353A | 8/1989 | Japan . |
| 4-7373A | 1/1992 | Japan . |
| 4-016546A | 1/1992 | Japan . |
| 4-91173A | 3/1992 | Japan . |
| 4-163552A | 6/1992 | Japan . |
| 4-223468A | 8/1992 | Japan . |
| 5-188591A | 7/1993 | Japan . |
| 5-313008A | 11/1993 | Japan . |

*Primary Examiner*—John S. Chu
*Attorney, Agent, or Firm*—Foley & Lardner

[57] ABSTRACT

A colored, photosensitive resin composition of a pigment dispersing-type is disclosed.

The colored, photosensitive resin composition is characterized by containing (a) a polymer having alcohlic or phenolic hydroxyl groups, (b) a compound capable of producing a nitrene when irradiated with an actinic radiation, (c) a pigment, and (d) a solvent. Preferably, the composition further contains (e) a heat crosslinking agent and/or (f) a compound having a polymerizable double bond in addition to the above ingredients.

According to the present invention, the production of a color filter need not be performed in an inert gas atmosphere, does not require an oxygen barrier film and does not require heating during the period of from the exposure step to the development step. Thus, the use of the composition permits the color filter production steps to be made significantly simple so that the composition provides a great value in industrial utilization.

18 Claims, 1 Drawing Sheet

COLORED, PHOTOSENSITIVE RESIN COMPOSITION

TECHNICAL FIELD

The present invention relates to a colored, photosensitive resin composition for forming a colored image and, more specifically, to a colored, photosensitive resin composition useful for preparing color filters used in liquid crystal display, imaging devices, etc.

BACKGROUND ART

A color filter used in a liquid crystal display, an imaging device or the like element generally has a construction in which pixels in a mosaic or stripe form are arranged on a transparent substrate such as a glass and has been hitherto prepared by a dyeing method (T. Uchida et al, Record of International Display Res. Conf. (1982), 166, IEEE Trans. ED-30 (1983) 503), an electrodeposition method (M. Suginoya et al, Proc. Japan Display '83 (1983 206) or a printing method (Tsuda et al, Proceedings of 13th Liquid Crystal Forum (1987) 22).

According to the dyeing method, a perchromate or a water soluble azide is added to a water soluble polymer such as gelatin, casein or polyacrylamide to impart photosensitivity thereto. After exposure, a development step is performed to obtain a relief pattern which in turn is colored to obtain a colored image. By repeating the coloring step for red, blue and green colors to obtain a color filter. To prevent color mixing, a coloration preventing treatment with tannic acid is performed between the respective coloring steps or an intermediate layer of an acrylic resin is formed. Thus, the dyeing method includes complicated steps, so that it is difficult to control the color tone. Further, the dyeing method has drawbacks that the water soluble polymer which is a dyeing medium has poor heat resistance and the color has poor heat resistance and poor weatherability.

To solve the above defects, studies have been made on the electrodeposition method, printing method and pigment dispersing method. With the electrodeposition method, however, the colored film is so thick that there are caused problems such as a large voltage drop and a limitation in pattern arrangement. The printing method has drawbacks because of poor dimensional accuracy and poor surface smoothness.

To solve the drawbacks of the conventional methods, there is proposed a pigment dispersing method. In this method, a pigment is dispersed in a photosensitive resin and the dispersion is applied onto a substrate. After drying, exposure and development are carried out to obtain a colored image. Thus, this method has a merit that it enables to obtain color filters by a simpler process in comparison with the dyeing method. A variety of photosensitive resins have been proposed for use in the pigment dispersing method, such as photosensitive polyimide resins disclosed in JP-A-60-237403, photosensitive resins composed of an acrylic polymer and an azide compound and disclosed in JP-A-1-200353, 4-7373 and 4-91173, photosensitive resins composed of an acrylate monomer, an organic polymer binder and a photopolymerization initiator and disclosed in JP-A-1-152449, and a chemically amplified-type photosensitive resins composed of a phenolic resin, a crosslinking agent having an N-methylol structure and an agent capable of generating an acid upon irradiation with a light and disclosed in JP-A-4-163552.

While a high heat resistance is obtainable when a photosensitive polyimide is used as the photosensitive resin for the pigment dispersing method, there are drawbacks because of low sensitivity and of necessity to use an organic solvent in the development step. With a conventional system in which an azide compound is used as the photosensitive agent, there involve problems because of low sensitivity, poor heat resistance and susceptibility to oxygen during the exposing step. A system in which radical polymerization of an acrylate monomer is utilized poses a problem that the exposure step is affected by oxygen, though the sensitivity is high. To avoid the influence of oxygen, therefore, it is necessary to form an oxygen barrier film or to perform the exposure in an inert atmosphere. But this requires a complicated process and an expensive apparatus. The chemically amplified-type photosensitive resin for forming a image by a catalytic reaction by an acid generated upon exposure can give high sensitivity and is not adversely affected by oxygen during exposure. However, there involves a problem because it is necessary to introduce a heating step between the exposure and development steps and because the sensitivity and the pattern shape are affected by a period of time from the exposure to the development, so that it is difficult to control the process.

It is, therefore, an object of the present invention to provide a colored, photosensitive resin composition which has such excellent characteristics that it has high sensitivity, it is hardly affected by oxygen, it does not require a heat treatment between exposure-development steps, it does not cause a change of sensitivity and pattern shape with time from the exposure to the development, it has high heat resistance and it permits the use of an aqueous system in the development step.

DISCLOSURE OF THE INVENTION

The present inventors have made an extensive study in view of the foregoing circumstance and found that the use of a mixture having the following composition in the pigment dispersing method can permit easy polymerization even in the presence of oxygen and formation of an image by development without any heating treatment after the exposure. As a result, the present invention has been accomplished.

Thus, according to the present invention there is provided a colored, photosensitive resin composition characterized in that said composition comprises:

(a) a polymer having alcoholic or phenolic hydroxyl groups, (b) a compound capable of producing a nitrene when irradiated with an actinic radiation, (c) a pigment, and (d) a solvent.

The present invention also provides a colored, photosensitive resin composition which further includes (e) a heat crosslinking agent and/or (f) a compound having a polymerizable double bond.

These colored, photosensitive resin compositions are suitably adopted to a pigment dispersing method for the preparation of color filters.

The present invention will now be described in detail below.

In the present invention, a polymer having alcoholic or phenolic hydroxyl groups is used as a binder. As the phenolic hydroxyl group-containing polymer, there may be mentioned an alkali-soluble phenolic resin. More particularly, such polymers may be condensates of formaldehyde with phenol or cresol (novolak resins), polyvinylphenols which may be substituted with $C_1$–$C_4$ alkyl groups, halogen atoms, etc. (for example, poly(4-hydroxystyrene)), copolymers of acrylic acid or methacrylic acid with at least one of the monomers having the following formulas (I)–(V):

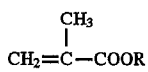  (I)

wherein R represents a lower alkyl group, an aromatic group, a lower alkyl group having a hydroxyl group or an aromatic group having a hydroxyl group,

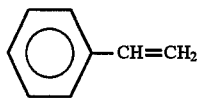  (II)

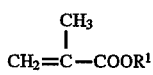  (III)

wherein $R^1$ represents a $C_1$–$C_{10}$ alkyl group, a $C_1$–$C_{10}$ cycloalkyl group, a hydroxy-substituted $C_1$–$C_{10}$ alkyl group or —$CH_2$—$CH_2$—OH,

  (IV)

wherein $R^1$ has the same meaning as above,

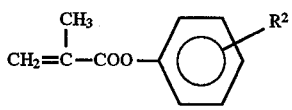  (V)

wherein $R^2$ represents a hydroxyl group, a hydrogen atom, a lower alkyl group, an aromatic group, a lower alkyl group having a hydroxyl group or an aromatic group having a hydroxyl group, and blends thereof.

In the present invention, the compound capable of forming a nitrene upon being irradiated with an actinic radiation may be a compound having an azide group within a molecule thereof. Azide compounds having a structure in which an azide group is bonded to an aromatic nucleus or a heteroaromatic nucleus are preferred for reasons of thermal stability. The number of the azide group may be one or more. Illustrative of suitable azide compounds are as follows:

azidostilbenes and derivatives thereof such as 4,4'-diazidostilbene, 4,4'-diazidostilbene-2,2'-disulfone-N,N-diethyleneoxyethylamide, 4,4'-diazidostilbene-2,2'-disulfone-N-propylhydroxyamide, 4,4'-diazidostilbene-2,2'-disulfonic acid, 4,4'-diazidostilbene-2,2'-disulfone-N,N-diethylamide and sodium 4,4'-diazidostilbene-2,2'-disulfonate; azidobenzalcyclohexanones and derivatives thereof such as 2,6-di(p-azidobenzal)cyclohexanone, 2,6-di(p-azidobenzal)-4-methylcyclohexanone, 2,6-di(p-azidobenzal)-4-tert-amylcyclohexanone and 2,6-di(p-azidocinnamylidene)-4-tert-amylcyclohexanone; azidocinnamylidenecyclohexanones and derivatives thereof; and azidobenzalketones and derivatives thereof such as p-azidobenzalacetophenone, p-azidobenzalacetone, 4,4'-diazidochalcone, 2,6-bis(4'-azidobenzal)-acetone, 2,6-bis(4'-azidobenzal)-acetone-2'-sulfo-N,N-diethyeleoxyethylamide, 2,6-bis(4'-azidobenzal -acetone-2,2'-disulfo-N,N-diethyeleoxyethylamide.

Azide compounds having azide groups incorporated into polymer chains may also be used. The above azide compounds may be used singly or as a mixture of two or more.

A sensitizer may be used in combination for improving the sensitivity. Examples of the sensitizers include 2-nitrofluorene, 2,4,7-trinitrofluorenone, benzanthrone, picramide, 1,2-benzanthraquinone, 11-chloro-6-hydroxybenzanthrone, phenanthranquinone, 4,(4-butoxyphenyl)-2,6-diphenylthiopyryliumperchlate.

As the pigment in the present invention, there may be used, for example, organic pigments such as condensed polycyclic pigments, e.g. anthraquinone-type and perylene-type pigments, phthalocyanine pigments azo pigments, and inorganic pigments such as carbon black. These pigments may be used singly or as a mixture of two or more.

In the present invention, it is preferable to use a dispersing agent for dispersing the pigment in the mixture. The dispersing agent may be added into the pigment such that the pigment is previously surface-treated therewith. Alternatively, the dispersing agent may be added in a form separated from the pigment. Nonionic, anionic or cationic dispersing agents may be used. Illustrative of the dispersing agents are polyalkylene glycols and esters thereof, polyoxyalkylenes, alkylene oxide adducts of an ester of a polyhydric alcohol, alkylene oxide adducts of an alcohol, alkylene oxide adducts of an alkylphenol, sulfonic acid esters, sulfonic acid salts, carboxylic acid esters, carboxylic acid salts, alkylene oxide adducts of an alkylamide and alkylamines. These dispersing agents may be used by themselves or a combination of two or more. Rosin and unsaturated carboxylic acid-modified rosin may also be used. The amount of the dispersing agent is preferably 0–20% by weight based on the weight of the pigment.

As the solvent used in the present invention, there may be mentioned ethyl cellosolve, propylene glycol monomethyl ether acetate (PGMEA), ethyl lactate, polyethylene glycol, polypropylene glycol, cyclohexane or propylene glycol methyl ether. These may be used singly or as a mixed solvent. A stabilizing agent, an antioxidant, etc. may be added to the mixture of the present invention.

It is preferred that the mixture of the present invention contain various heat crosslinking agent for improving cracking resistance and resistance to solvents. Especially, when a polystyrene derivative such as poly(4-hydroxystyrene) is used as the binder, the use of a heat crosslinking agent in conjunction therewith is preferred. Such heat crosslinking agent may be, for example, a compound having at least two, different or same residues, such as alkoxy and acyloxy, capable of reacting with the binder to form a crosslinked matrix. Examples of the crosslinking agents include bis-, tris- or tetra-hydroxymethyl-substituted aromatic compounds or heterocyclic aromatic compounds; bis, tris- or tetra-acetoxymethyl-substituted aromatic compounds or heterocyclic aromatic compounds; melamines having N-hydroxymethyl groups, N-alkoxymethyl groups or N-acyloxymethyl groups; epoxy compounds such as novolak epoxy resins, bisphenol A epoxy resins, halogenated bisphenol A epoxy resins and alicyclic epoxy resins; and acetal resins such as polyvinylbutyrals. These crosslinking agents may be used by themselves or in combination of two or more.

The proportion of the ingredients (a) and (b) in the composition according to the present invention except the pigment (c) and the solvent (d) is preferably such that the content of the binder (a) is 40–98% by weight and the content of the compound (b) is 30–2% by weight, more preferably 25–5% by weight, though the content of the compound (b) varies with the number of functional groups generating a nitrene and with the efficiency thereof to generate the nitrene. The amount of the heat crosslinking agent (e) when used is 0.25–0.025 part by weight per part by weight of the binder (a). It is preferred that the compound (b) is used in an amount of 30–2% by weight, more preferably 25–5% by weight, based on the total weight of the binder (a) and the heat crosslinking agent (e). The amount of the organic or inorganic pigment is 0.1–2 parts by weight per part by weight of the above mixture. The solvent (d) is suitably used in an amount of 1–15 parts by weight, preferably 2–10 parts by weight, per part by weight of the total ingredients other than the solvent.

When a compound having an azide group in the molecule thereof is used as the compound (b) generating a nitrene upon irradiation with an actinic radiation in a large amount, the color pattern may become yellowish upon exposure or heating so that the transmittance of the blue color pattern may be reduced.

In such a case, by addition of a compound having a polymerizable double bond (ingredient (f)), it is possible to form a colored pattern having satisfactory sensitivity and to obtain a color filter having satisfactory transmittance even when the amount of the azide-containing compound in the composition is reduced. The amount of the polymerizable double bond-containing compound (f) is preferably 0.02–0.3 part by weight per part by weight of the binder (a) or a total of the binder (a) and the heat crosslinking agent (e). In this case, the amount of the compound (b) is 20–2% by weight based on the total weight of the binder (a) and polymerizable double bond-containing compound (f) or the total weight of the binder (a), compound (f) and the heat crosslinking agent (e).

As the compound (f) having a polymerizable double bond, there may be mentioned various vinyl monomers and oligomers. Illustrative of compounds (f) are an acrylic acid monomer, an acrylic acid oligomer, a methacrylic acid monomer, a methacrylic acid oligomer, an acrylate and a methacrylate. The acrylate and methacrylate may be acrylic and methacrylic acid esters of a polyhydric alcohol such as ethylene glycol or trimethylolpropanol. Acrylic and methacrylic acid esters of a polymer having alcoholic hydroxyl groups, such as polyvinyl alcohol, may be also included in the acrylate and methacrylate. Also included in the present invention are acrylate melamine, methacrylate melamine, urethane acrylate and urethane methacrylate.

More concrete examples of the compound (f) include 2-hydroxyethyl methacrylate, n-butyl methacrylate, glycidyl methacrylate, polyethylene glycol methacrylate, 2-ethylhexyl acrylate, diethylene glycol dimethacrylate, trimethylolethane trimethacrylate, trimethylolpropane trimethacrylate, tetramethylolmethane tetramethacrylate, tetramethylolmethane tetracrylate and trimethoxymethyltrimethyl(oxyethylene methacrylate) melamine.

The mixture of the present invention is applied to a glass substrate for a color filter by spin coating, roller coating, spray coating or any suitable coating method to obtain a coated layer having a thickness of, for example, 0.5–10 µm. The layer is then irradiated with an actinic radiation so that a desired pattern of the color filter is formed. The source of the radiation is generally a UV of 190–450 nm, preferably 200–400 nm. If desired, radiation of an electron beam or X-ray beam may be suitably used. During the irradiation, it is not necessary to remove oxygen. Thus, the irradiation can be carried out without use of an inert gas such as nitrogen and without use of a protecting film for shielding oxygen. After irradiation, the coated layer is treated with a developing liquid to dissolve the unirradiated portion thereof to form a pattern required for the color filter. The above procedures are repeated for necessary colors, thereby obtaining a color filter having the desired pattern. In the above procedures, the image pattern as obtained after the development may be further hardened by heating or irradiation with an actinic radiation for improving the cracking resistance and solvent resistance.

In the present invention, the pattern can be obtained in the above manner. Thus, by the irradiation with the actinic radiation, a nitrene which is biradical of chemically active nitrogen is formed. The nitrene then reacts with the binder to form a crosslinked matrix so that the irradiated portion is insolubilized in an aqueous alkali solution. The developing liquid may contain, for example, ammonia or a silicate, metasilicate, hydroxide, hydrogenphosphate of an alkali metal, alkaline earth metal or, especially, ammonium ion. As a metal-free developing agent, there may be used the conventional agent disclosed in, for example, U.S. Pat. No. 4,729,941 and EP-A-62,733. If desired, a surfactant, a cleansing agent or an organic solvent may be added into the developing liquid for the purpose of supplementing the removal of pigment residues during the development. Such additives to be added to the developing liquid for the above-mentioned purposes may be, for example, a nonionic surfactant, an ionic surfactant, an alcohol, a carboxylic acid, an amine or a derivative thereof. Concrete examples of the additives include polyalkylene glycols or esters thereof, polyoxyalkylenes, alkylene oxide adducts of polyhydric alcohol esters, alkylene oxide adducts of alcohols, alkylene oxide adducts of alkylphenols, sulfonic acid esters, sulfonic acid salts, carboxylic acid esters, carboxylic acid salts, alkylene oxide adducts of alkylamides and alkylamines. These additives may be used by themselves or in combination of two or more. The amount of the additive is 0.1–3.0% by weight based on the weight of the developing liquid.

The nitrene is inactivated by oxygen contained in air. Thus, the conventional composition containing an acrylic polymer and an acrylate monomer as basic ingredients requires the exposing step to be carried out under an inert gas atmosphere or using an oxygen barrier film in order to obtain a pattern with a suitable sensitivity, since otherwise the nitrene formed by the decomposition of an azide would be inactivated by oxygen due to the fact that the composition has good oxygen permeability. In the composition of the present invention, the influence of oxygen is scarcely found probably because the composition per se has oxygen barrier property. Thus, even when the exposure is performed in air, a good pattern with good sensitivity is obtainable.

With the conventional composition using a chemically amplified-type sensitive resin, it is necessary to perform a heating treatment after the exposure but before the development, since the crosslinked matrix is formed by catalytic reaction using an acid formed by the exposure. In contrast, in the present invention, the crosslinking proceeds by the radical reaction if the nitrene so that it is not necessary to subject the exposed product to a heat treatment. An image pattern can be obtained by developing the exposed product. Thus, with the composition according to the present invention, the process can be significantly simplified.

Since the colored, photosensitive resin composition according to the present invention has the above construction, the production of a color filter need not be performed in an inert gas atmosphere, does not require an oxygen barrier film and does not require heating during the period of from the exposure step to the development step. Thus, the use of the composition permits the color filter production steps to be made significantly simple so that the composition provides a great value in industrial utilization.

EXAMPLES

Figure 1:
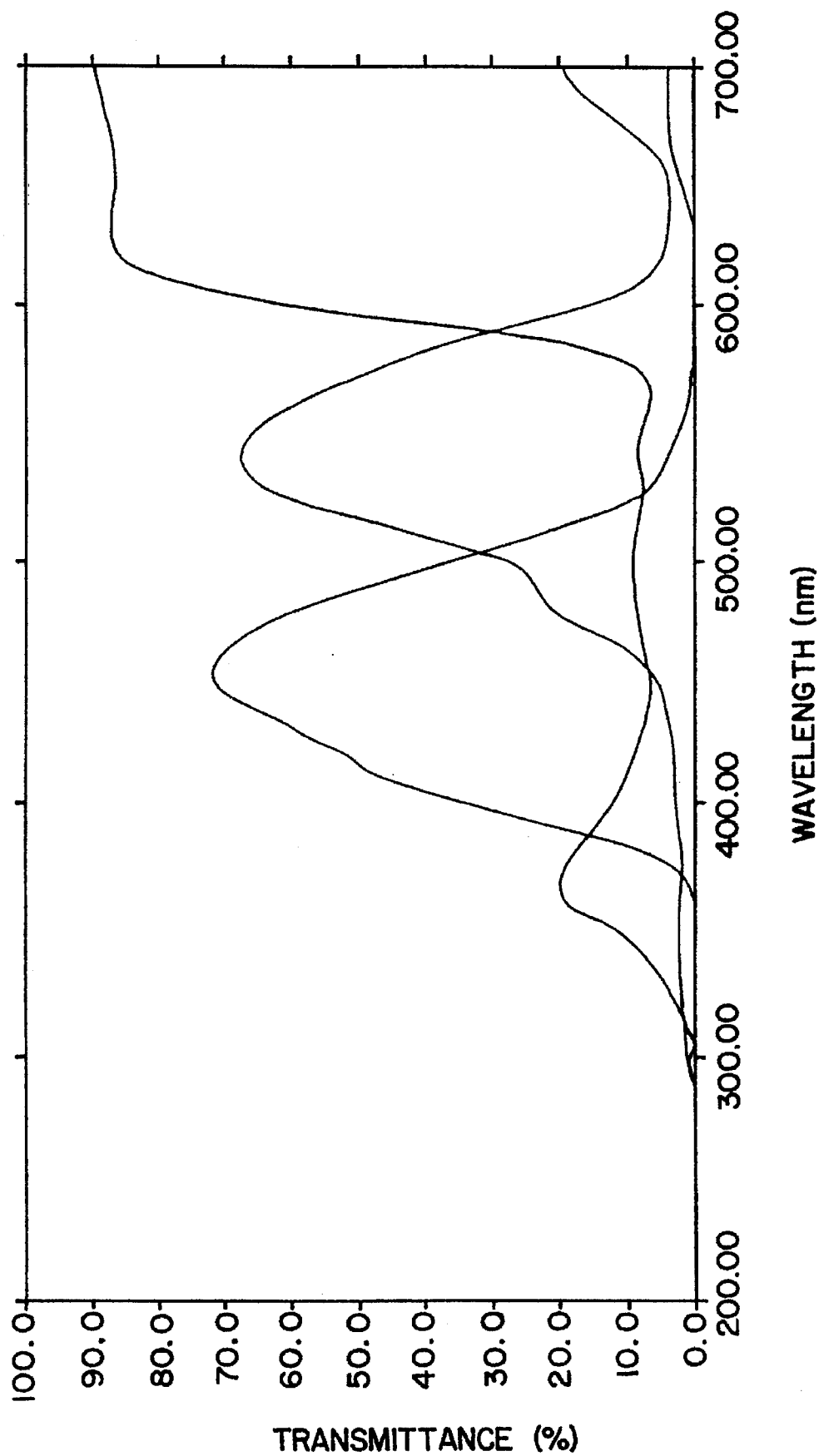
FIG. 1 is a transmission spectrum in a visible region of the colored layer of the color filter obtained in Example 1.

The present invention will be further described in more detail by way of examples. The present invention is, however, not limited to the examples. Azide compounds used in the examples are shown in Table 1.

TABLE 1

| Abbreviation | Structural Formula |
|---|---|
| Azide I | $N_3$—⌬—CH=CH—⌬—$N_3$ (with Z substituents) |
| Azide II | $N_3$—⌬—CH=CHC(=O)—⌬—$N_3$ (with Y substituent) |
| Azide III | $N_3$—⌬—CH=CHC(=O)—⌬—$N_3$ |

Z: —SO$_2$N(CH$_2$CH$_2$OCH$_2$CH$_3$)$_2$

Y: —SO$_2$N(CH$_2$CH$_2$OCH$_3$)$_2$

Example 1

A clean glass substrate was used as a transparent substrate for the preparation of a color filter. The following six kinds of colored, photosensitive resin compositions were prepared.

(1) Composition for Red Coloration

| | |
|---|---|
| Polyhydroxystyrene (average molecular weight: about 15,000) | 40 g |
| Azide I | 15 g |
| Red Pigment Dispersion Containing Dispersing Agent (Pigment Content: 17 wt %) | 205 g |
| Hexamethoxymethylmelamine (heat cross-linking agent) | 6 g |

To the above composition was added propylene glycol monomethyl ether acetate as a solvent to obtain a composition in which the content of the ingredients other than the solvent was 20% by weight.

(2) Composition for Blue Coloration

The above procedure for the preparation of the red composition was repeated in the same manner as described except that 100 g of a blue pigment dispersion containing a dispersing agent (pigment content: 17% by weight) were used in place of the red pigment dispersion.

(3) Composition for Green Coloration

The above procedure for the preparation of the red composition was repeated in the same manner as described except that 205 g of a green pigment dispersion containing a dispersing agent (pigment content: 17% by weight) were used in place of the red pigment dispersion.

(4) Composition for Black Coloration for Black Matrix

The above compositions for red, blue and green coloration were mixed with each other in an equal amount to obtain a black color composition.

(5) Composition for Black Coloration for Black Matrix

The above procedure for the preparation of the red composition was repeated in the same manner as described except that 205 g of a carbon black dispersion containing a dispersing agent (pigment content: 17% by weight) were used in place of the red pigment dispersion.

(6) Composition for Black Coloration for Black Matrix

The above procedure for the preparation of the black composition (4) was repeated in the same manner as described except that 35 g of carbon black were additionally incorporated.

Onto the glass substrate were applied the above six kinds of the compositions by spin coating each to a thickness of about 1.2 μm. Each coated layer was dried at 100° C. for 1 minute on a hot plate. The exposure of each of the colored photosensitive resin layers was carried out in air with a high pressure mercury lamp using a mask of a predetermined shape. The resulting pattern-exposed, colored photosensitive resin layer was then developed with a 2.5% aqueous tetramethylammonium hydroxide solution. The thus obtained colored pattern had uniform colors and had sharp edges.

The thickness and clarity (transmittance) of the colored layer of the thus obtained color filter are shown in Table 2. The transmission spectra of the colored layers containing red, blue and green pigments in a visible region are shown in FIG. 1.

TABLE 2

| Color | Wave Length | Clarity | Thickness |
|---|---|---|---|
| red | 620 nm | 90% | 1 μm |
| blue | 460 nm | 75% | 1 μm |
| green | 540 nm | 68% | 1 μm |

Example 2

Example 1 was repeated in the same manner as described except that the polyhydroxystyrene used had an average molecular weight of about 8,000 to obtain colored, photosensitive compositions. Using these compositions, the procedure of Example 1 was repeated in the same manner except that the development was performed with a 0.15N aqueous tetramethylammonium hydroxide solution, thereby obtaining a colored pattern having uniform colors.

Example 3

Example 1 was repeated in the same manner as described except that the polyhydroxystyrene used had an average molecular weight of about 20,000 to obtain colored, photosensitive compositions. Using these compositions, the procedure of Example 1 was repeated in the same manner except that the development was performed with a 2% aqueous tetramethylammonium hydroxide solution, thereby obtaining a colored pattern having uniform colors and sharp edges.

Example 4

Example 1 was repeated in the same manner as described except that Azide II (4 g) was substituted for Azide I to obtain colored, photosensitive compositions. Using these compositions, the procedure of Example 1 was repeated in the same manner except that the development was performed with a 0.15N aqueous tetramethylammonium hydroxide solution, thereby obtaining a colored pattern having uniform colors and sharp edges.

Example 5

Example 1 was repeated in the same manner as described except that Azide III (7 g) was substituted for Azide I to obtain colored, photosensitive compositions. Using these compositions, the procedure of Example 1 was repeated in the same manner except that the development was performed with a 0.15N aqueous tetramethylammonium hydroxide solution, thereby obtaining a colored pattern having uniform colors and sharp edges.

Example 6

The following colored, photosensitive resin compositions were prepared.
(1) Composition for Red Coloration

| | |
|---|---|
| Novolak Resin (average molecular weight: about 1,500) | 40 g |
| Azide I | 7 g |
| Red Pigment Dispersion Containing Dispersing Agent (Pigment Content: 17 wt %) | 205 g |

To the above composition was added propylene glycol monomethyl ether acetate as a solvent to obtain a composition in which the content of the ingredients other than the solvent was 20% by weight.
(2) Composition for Blue Coloration The above procedure for the preparation of the red composition was repeated in the same manner as described except that 100 g of a blue pigment dispersion containing a dispersing agent (pigment content: 17% by weight) were used in place of the red pigment dispersion.
(3) Composition for Green Coloration The above procedure for the preparation of the red composition was repeated in the same manner as described except that 205 g of a green pigment dispersion containing a dispersing agent (pigment content: 17% by weight) were used in place of the red pigment dispersion.
(4) Composition for Black Coloration for Black Matrix The above compositions for red, blue and green coloration were mixed with each other in an equal amount to obtain a black color composition.
(5) Composition for Black Coloration for Black Matrix The above procedure for the preparation of the red composition was repeated in the same manner as described except that 205 g of a carbon black dispersion containing a dispersing agent (pigment content: 17% by weight) were used in place of the red pigment dispersion.
(6) Composition for Black Coloration for Black Matrix The above procedure for the preparation of the black composition (4) was repeated in the same manner as described except that 35 g of carbon black were additionally incorporated.

Onto a glass substrate were applied the above six kinds of the compositions by spin coating each to a thickness of about 1.2 μm. Each coated layer was dried at 100° C. for 1 minute on a hot plate. The exposure of each of the colored photosensitive resin layers was carried out in air with a high pressure mercury lamp using a mask of a predetermined shape. The resulting pattern-exposed, colored photosensitive resin layer was then developed with a 4.5% aqueous tetramethylammonium hydroxide solution. The thus obtained colored pattern had uniform colors and had sharp edges.

Example 7

Example 6 was repeated in the same manner as described except that the novolak resin used had an average molecular weight of about 5,000 to obtain colored, photosensitive compositions. Using these compositions, the procedure of Example 6 was repeated in the same manner, thereby obtaining a colored pattern having uniform colors and sharp edges.

Example 8

Example 6 was repeated in the same manner as described except that the novolak resin used had an average molecular weight of about 3,000 to obtain colored, photosensitive compositions. Using these compositions, the procedure of Example 6 was repeated in the same manner, thereby obtaining a colored pattern having uniform colors and sharp edges.

Example 9

Example 6 was repeated in the same manner as described except that Azide II (10 g) was substituted for Azide I to obtain colored, photosensitive compositions. Using these compositions, the procedure of Example 6 was repeated in the same manner, thereby obtaining a colored pattern having uniform colors and sharp edges.

Example 10

Example 6 was repeated in the same manner as described except that Azide III (15 g) was substituted for Azide I to obtain colored, photosensitive compositions. Using these compositions, the procedure of Example 6 was repeated in the same manner, thereby obtaining a colored pattern having uniform colors and sharp edges.

Examples 11–20

Examples 1–10 were repeated in the same manner as described except that the aqueous tetramethylammonium hydroxide solution used as the developer further contained 1% of a mixture of equal amounts of polyoxyethylenelauryl ether sulfate, an ethylenediamine tetraacetic acid salt and ethyl α-N-cocoyl-L-alginate DL-pyrrolidone carboxylate. The colored pattern thus obtained had uniform colors and sharp edges.

Examples 21–30

Example 1 was repeated in the same manner as described except that the 2% aqueous tetramethylammonium hydroxide solution used as the developer further contained each of the additives I–X shown in Table 3. The colored patterns thus obtained had uniform colors and sharp edges.

Examples 31–40

Example 8 was repeated in the same manner as described except that the 4.5% aqueous tetramethylammonium hydroxide solution used as the developer further contained each of the additives I–X shown in Table 3. The colored patterns thus obtained had uniform colors and sharp edges.

TABLE 3

| Additive (amount) | Name of Compound |
|---|---|
| I (1%) | Nonylphenol ethylene oxide(10 mols) adduct |
| II (1%) | N,N-Dihydroxyethyllauramide |
| III (1%) | Sodium p-dodecylbenzenesulfonate |
| IV (0.5%) | Sodium lauric acid ester |
| V (0.5%) | Sorbitan monolaurate ethylene oxide(20 mols) adduct |
| VI (0.5%) | Polyethylene glycol (molecular weight: 1000) |
| VII (0.5%) | Polyethylene glycol (molecular weight: 600) monooleate |
| VIII (0.2%) | Lauryl alcohol ethylene oxide(20 mols) adduct |
| IX (0.2%) | Cetylethylmorpholinium ethosulfate |
| X (0.1%) | Isopropanol |

Example 41

Each of the colored patterns obtained in Examples 1–40 was heated at 230° C. for 15 minutes on a hot plate. After being allowed to be cooled, each pattern was immersed in N-methylpyrrolidone for 30 minutes and then observed with a microscope. No deterioration of the shape of the pattern was observed, indicating that the patterns of Examples 1–40 showed good solvent resistance. It was revealed that the colored, photosensitive resin composition had good solvent resistance and was useful for the preparation of color filters.

Example 42

Example 1 was repeated in the same manner as described except that 40 g of a hydroxystyrene-methyl methacrylate copolymer (copolymerization ratio: 1:1, average molecular weight: about 8,000) were used in place of the polyhydroxystyrene to obtain a colored, photosensitive composition. Using this composition, the development was carried out with a 0.2N aqueous tetramethylammonium hydroxide solution, thereby obtaining a colored pattern having uniform colors and sharp edges.

Colored, photosensitive resin compositions containing compounds having a polymerizable double bond (namely vinyl monomer) will be shown in Examples 43–49 below. The structures of the vinyl monomers are shown in Table 4

TABLE 4

| Monomer | Structural Formula |
|---|---|
| I | $CH_3-\underset{\underset{CH_2}{\|\|}}{C}-\overset{O}{\overset{\|\|}{C}}-OCH_2CH_2OC(CH_2)_5OH$ |
| II | $CH_3-\underset{\underset{CH_2}{\|\|}}{C}-\overset{O}{\overset{\|\|}{C}}-OCH_2CH_2O\overset{O}{\overset{\|\|}{C}}-\underset{\underset{CH_2}{\|\|}}{C}-CH_3$ |
| III | $CH_3-\underset{\underset{CH_2}{\|\|}}{C}-\overset{O}{\overset{\|\|}{C}}-OCH_2-\underset{\underset{CH_2CH_3}{\|}}{\overset{\overset{CH_2OC-C-CH_3}{\overset{O\ CH_2}{\|\|\ \|\|}}}{C}}-CH_2O\overset{O}{\overset{\|\|}{C}}-\underset{\underset{CH_2}{\|\|}}{C}-CH_3$ |

Example 43

The following six kinds of colored, photosensitive resin compositions were prepared.

(1) Composition for Red Coloration

| | |
|---|---|
| Polyhydroxystyrene (average molecular weight: about 8,000) | 40 g |
| Monomer I | 12 g |
| Hexamethoxymethylmelamine | 6 g |
| Azide I | 3 g |
| Red Pigment Dispersion Containing Dispersing Agent (Pigment Content: 17 wt %) | 180 g |

To the above composition was added propylene glycol monomethyl ether acetate as a solvent to obtain a composition in which the content of the ingredients other than the solvent was 20% by weight.

(2) Composition for Blue Coloration

The above procedure for the preparation of the red composition was repeated in the same manner as described except that 90 g of a blue pigment dispersion containing a dispersing agent (pigment content: 17% by weight) were used in place of the red pigment dispersion.

(3) Composition for Green Coloration

The above procedure for the preparation of the red composition was repeated in the same manner as described except that 180 g of a green pigment dispersion containing a dispersing agent (pigment content: 17% by weight) were used in place of the red pigment dispersion.

(4) Composition for Black Coloration for Black Matrix

The above compositions for red, blue and green coloration were mixed with each other in an equal amount to obtain a black color composition.

(5) Composition for Black Coloration for Black Matrix

The above procedure for the preparation of the red composition was repeated in the same manner as described except that 180 g of a black pigment dispersion containing a dispersing agent (pigment content: 17% by weight) were used in place of the red pigment dispersion.

(6) Composition for Black Coloration for Black Matrix

The above procedure for the preparation of the black composition (4) was repeated in the same manner as described except that 30 g of carbon black were additionally incorporated.

Onto a glass substrate were applied the above six kinds of the compositions by spin coating each to a thickness of about 1.5 μm. Each coated layer was dried at 100° C. for 1 minute on a hot plate. The exposure of each of the colored photosensitive resin layers was carried out in air with a high pressure mercury lamp using a mask of a predetermined shape. The resulting pattern-exposed, colored photosensitive resin layer was then developed with a 0.15N aqueous tetramethylammonium hydroxide solution. The thus obtained colored pattern had uniform colors and had sharp edges.

Example 44

The following three kinds of colored, photosensitive resin compositions were prepared.

(1) Composition for Red Coloration

| | |
|---|---|
| Hydroxystyrene-methyl methacrylate copolymer (copolymerization ratio: 1:1, average molecular weight: about 8,000) | 40 g |
| Hexabutoxymethylmelamine | 6 g |
| Azide I | 15 g |
| Red Pigment Dispersion Containing Dispersing Agent (Pigment Content: 17 wt %) | 180 g |

To the above composition was added propylene glycol monomethyl ether acetate as a solvent to obtain a composition in which the content of the ingredients other than the solvent was 20% by weight.

(2) Composition for Blue Coloration

The above procedure for the preparation of the red composition was repeated in the same manner as described except that 90 g of a blue pigment dispersion containing a dispersing agent (pigment content: 17% by weight) were used in place of the red pigment dispersion.

(3) Composition for Green Coloration

The above procedure for the preparation of the red composition was repeated in the same manner as described except that 180 g of a green pigment dispersion containing a dispersing agent (pigment content: 17% by weight) were used in place of the red pigment dispersion.

Onto a glass substrate were applied the above three kinds of the compositions by spin coating each to a thickness of about 1.5 µm. Each coated layer was dried at 100° C. for 1 minute on a hot plate. The exposure of each of the colored photosensitive resin layers was carried out in air with a high pressure mercury lamp using a mask of a predetermined shape. The resulting pattern-exposed, colored photosensitive resin layer was then developed with a 0.15N aqueous tetramethylammonium hydroxide solution. The thus obtained colored pattern had uniform colors and had sharp edges.

Example 45

The following three kinds of colored, photosensitive resin compositions were prepared.

(1) Composition for Red Coloration

| | |
|---|---|
| Polyhydroxystyrene (average molecular weight: about 8,000) | 40 g |
| Monomer I | 6 g |
| Hexamethoxymethylmelamine | 6 g |
| Azide I | 3 g |
| Red Pigment Dispersion Containing Dispersing Agent (Pigment Content: 17 wt %) | 160 g |

To the above composition was added propylene glycol monomethyl ether acetate as a solvent to obtain a composition in which the content of the ingredients other than the solvent was 20% by weight.

(2) Composition for Blue Coloration

The above procedure for the preparation of the red composition was repeated in the same manner as described except that 80 g of a blue pigment dispersion containing a dispersing agent (pigment content: 17% by weight) were used in place of the red pigment dispersion.

(3) Composition for Green Coloration

The above procedure for the preparation of the red composition was repeated in the same manner as described except that 160 g of a green pigment dispersion containing a dispersing agent (pigment content: 17% by weight) were used in place of the red pigment dispersion.

The above three kinds of the compositions were applied, dried, exposed and developed in the same manner as that in Example 43. The thus obtained colored pattern had uniform colors and had sharp edges.

Example 46

Example 45 was repeated in the same manner as described except that the amount of Monomer I was changed to 3 g. The developed color pattern had uniform colors and had sharp edges.

Example 47

Example 46 was repeated in the same manner as described except that Monomer I was replaced by monomer II (3 g). The developed color pattern had uniform colors and had sharp edges.

Example 48

Example 46 was repeated in the same manner as described except that Monomer I was replaced by Monomer III (3 g). The developed color pattern had uniform colors and had sharp edges.

Example 49

Example 45 was repeated in the same manner as described except that the amount of Azide I was changed to 6 g. The developed color pattern had uniform colors and had sharp edges.

Example 50

The following colored, photosensitive resin compositions for the preparation of a color filter were prepared.

(1) Composition for Red Coloration

| | |
|---|---|
| Polyhydroxystyrene (average molecular weight: about 20,000) | 40 g |
| Azide I | 15 g |
| Red Pigment Dispersion Containing Dispersing Agent (Pigment Content: 17 wt %) | 205 g |
| Hexabutoxymethylmelamine | 6 g |
| Polyoxyethylene (average molecular weight: about 800) | 0.3 g |

To the above composition was added propylene glycol monomethyl ether acetate as a solvent to obtain a composition in which the content of the ingredients other than the solvent was 20% by weight.

(2) Composition for Blue Coloration

The above procedure for the preparation of the red composition was repeated in the same manner as described except that 100 g of a blue pigment dispersion containing a dispersing agent (pigment content: 17% by weight) were used in place of the red pigment dispersion.

(3) Composition for Green Coloration

The above procedure for the preparation of the red composition was repeated in the same manner as described except that 205 g of a green pigment dispersion containing a dispersing agent (pigment content: 17% by weight) were used in place of the red pigment dispersion.

(4) Composition for Black Coloration for Black Matrix

The above compositions for red, blue and green coloration were mixed with each other in an equal amount to obtain a black color composition.

(5) Composition for Black Coloration for Black Matrix

The above procedure for the preparation of the red composition was repeated in the same manner as described except that 205 g of a carbon black dispersion containing a dispersing agent (pigment content: 17% by weight) were used in place of the red pigment dispersion.

(6) Composition for Black Coloration for Black Matrix

The above procedure for the preparation of the black composition (4) was repeated in the same manner as described except that 35 g of carbon black were additionally incorporated.

Onto a glass substrate were applied the above six kinds of the compositions by spin coating each to a thickness of about 1.2 µm. Each coated layer was dried at 100° C. for 1 minute on a hot plate. The exposure of each of the colored photosensitive resin layers was carried out in air with a high pressure mercury lamp using a mask of a predetermined shape. The resulting pattern-exposed, colored photosensitive resin layer was then developed with a 0.1N aqueous tetramethylammonium hydroxide solution. The thus obtained colored pattern had uniform colors and had sharp edges.

Example 51

Each of the colored patterns obtained in Examples 42–50 was heated at 230° C. for 15 minutes on a hot plate. After being allowed to be cooled, each pattern was immersed in propylene glycol monomethyl ether acetate for 30 minutes and then observed with a microscope. No deterioration of the shape of the pattern was observed, indicating that the patterns of Examples 42–50 showed good solvent resistance. It was revealed that the colored, photosensitive resin composition according to the present invention had good solvent resistance and was useful for the preparation of color filters.

We claim:

1. A colored, photosensitive resin composition comprising:
   (a) poly(4-hydroxystyrene),
   (b) a compound having an azide group capable of producing a nitrene when irradiated with actinic radiation,
   (c) a pigment,
   (d) a solvent, and
   (e) a heat crosslinking agent.

2. A colored, photosensitive resin composition as recited in claim 1, further comprising
   (f) a compound having a polymerizable double bond.

3. A colored, photosensitive resin composition as recited in claim 1, further comprising a dispersing agent.

4. A colored, photosensitive resin composition as recited in claim 1, wherein said azide-containing compound is at least one member selected from the group consisting of azidostilbenes, azidobenzalcyclohexanones, azidocinnamylidenecyclohexanones, azidobenzalketones, and derivatives thereof.

5. A colored, photosensitive resin composition as recited in claim 1, wherein the proportion of the ingredients (a) and (b) is such that the content of the ingredient (a) is 40–98% by weight and the content of the ingredient (b) is 30–2% by weight.

6. A colored, photosensitive resin composition as recited in claim 2, wherein the ingredient (f) is at least one member selected from the group consisting of an acrylic acid monomer, an acrylic acid oligomer, a methacrylic acid monomer, a methacrylic acid oligomer, an acrylate and a methacrylate.

7. A colored, photosensitive resin composition as recited in claim 1, wherein the azide-containing compound is selected from the group consisting of 4,4'-diazidostilbene, 4,4'-diazidostilbene-2,2'-disulfone-N,N-diethyleneoxyethylamide, 4,4'-diazidostilbene-2,2'-disulfone-N-propylhydroxyamide, 4,4'-diazidostilbene-2,2'-disulfonic acid, 4,4'-diazidostilbene-2,2'-disulfone-N,N-diethylamide, sodium 4,4'-diazidostilbene-2,2'-disulfonate, 2,6-di(p-azidobenzal)cyclohexanone, 2,6-di(p-azidobenzal)-4-methylcyclohexanone, 2,6-di(p-azidobenzal)-4-tert-amylcyclohexanone and 2,6-di(p-azidocinnamylidene)-4-tert-amylcyclohexanone, p-azidobenzalacetophenone, p-azidobenzalacetone, 4,4'-diazidochalcone, 2,6-bis(4'-azidobenzal)-acetone, 2,6-bis(4'-azidobenzal)-acetone-2'-sulfo-N,N-diethyeleoxyethylamide, 2,6-bis(4'-azidobenzal)-acetone-2,2'-disulfo-N and azide compounds having azide groups incorporated into polymer chains.

8. A colored, photosensitive resin composition as recited in claim 1, which further comprises a sensitizer.

9. A colored, photosensitive resin composition as recited in claim 8, wherein the sensitizer is selected from the group consisting of 2-nitrofluorene, 2,4,7-trinitrofluorenone, benzanthrone, picramide, 1,2-benzanthraquinone, 11-chloro-6-hydroxybenzanthrone, phenanthranquinone, and 4,(4-butoxyphenyl)-2,6-diphenyl-thiopyryliumperchlate.

10. A colored, photosensitive resin composition as recited in claim 3, wherein the dispersing agent is selected from the group consisting of polyalkylene glycols and esters thereof, polyoxyalkylenes, alkylene oxide adducts of an ester of a polyhydric alcohol, alkylene oxide adducts of an alcohol, alkylene oxide adducts of an alkylphenol, sulfonic acid esters, sulfonic acid salts, carboxylic acid esters, carboxylic acid salts, alkylene oxide adducts of an alkylamide and alkylamines, rosin and unsaturated carboxylic acid-modified rosin.

11. A colored, photosensitive resin composition as recited in claim 1, wherein the heat crosslinking agent has at least two groups capable of reacting with the poly(4-hydroxystyrene) to form a crosslinked matrix.

12. A colored, photosensitive resin composition as recited in claim 1, wherein the heat crosslinking agent is selected from the group consisting of bis-, tris- or tetra-hydroxymethyl-substituted aromatic compounds or heterocyclic aromatic compounds; bis, tris- or tetra-acetoxymethyl-substituted aromatic compounds or heterocyclic aromatic compounds; melamines having N-hydroxymethyl groups, N-alkoxymethyl groups or N-hydroxymethyl groups, N-alkoxymethyl groups or N-acyloxymethyl groups; epoxy compounds; and acetal resins.

13. A colored, photosensitive resin composition as recited in claim 1, that comprises 0.25 to 0.025 parts by weight of the heat crosslinking agent (e) per one part by weight of (a).

14. A colored, photosensitive resin composition as recited in claim 2, that comprises 0.02 to 0.3 parts by weight of compound (f) per one part by weight of (a) and (e).

15. A method of using the colored, photosensitive resin composition as recited in claim 1 to form a color filter, comprising
   applying the composition to a substrate to obtain a layer,
   irradiating the layer with actinic radiation so as to form a pattern of a desired color filter,
   developing the irradiated layer to dissolve the unirradiated portions thereof to form a pattern for the color filter,
   optionally repeating the above steps to obtain the desired color filter, and
   optionally hardening the obtained pattern.

16. A method according to claim 15, wherein the irradiating takes places in an oxygen containing atmosphere.

17. A method according to claim 15, wherein no heating treatment is performed between the irradiating and developing steps.

18. A method according to claim 15, wherein the developing is accomplished by use of an aqueous developer.

* * * * *